US012719488B2

(12) United States Patent
Huang

(10) Patent No.: US 12,719,488 B2
(45) Date of Patent: Aug. 25, 2026

(54) TIME INTERLEAVED ANALOG TO DIGITAL CONVERTER AND SIGNAL CONVERSION METHOD

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 152 days.

(21) Appl. No.: 18/741,867

(22) Filed: Jun. 13, 2024

(65) Prior Publication Data

US 2024/0429933 A1 Dec. 26, 2024

(30) Foreign Application Priority Data

Jun. 20, 2023 (TW) ................................ 112123270

(51) Int. Cl.
*H03M 1/12* (2006.01)

(52) U.S. Cl.
CPC ......... *H03M 1/1245* (2013.01); *H03M 1/121* (2013.01)

(58) Field of Classification Search
CPC ...... H03M 1/1245; H03M 1/121; H03M 1/10; H03M 1/12
USPC ................................ 341/155, 120, 118, 159
See application file for complete search history.

(56) References Cited

U.S. PATENT DOCUMENTS 9,065,464 B2 * 6/2015 Zhang ................. H03M 1/0624
2013/0106632 A1 5/2013 Petigny et al.
2021/0384932 A1 * 12/2021 O'Sullivan ............... H03F 1/42

OTHER PUBLICATIONS

N. Kurosawa, H. Kobayashi, K. Maruyama, H. Sugawara and K. Kobayashi, Explicit analysis of channel mismatch effects in time-interleaved ADC systems, in IEEE Transactions on Circuits and Systems I Fundamental Theory and Applications, vol. 48, No. 3, pp. 261-271, Mar. 2001, doi 10.110981.915383.

T.-H. Tsai, P. J. Hurst and S. H. Lewis, Correction of Mismatches in a Time-Interleaved Analog-to-Digital Converter in an Adaptively Equalized Digital Communication Receiver, in IEEE Transactions on Circuits and Systems I Regular Papers, vol. 56, No. 2, pp. 307-319, Feb. 2009, doi 10.1109TCSI.2008.2002114.

(Continued)

*Primary Examiner* — Peguy Jean Pierre
(74) *Attorney, Agent, or Firm* — WPAT, PC

(57) ABSTRACT

A time-interleaved analog-to-digital converter includes a plurality of sampling circuits, a plurality of analog-to-digital converter circuits, an output circuit, and a calibration circuit. The plurality of sampling circuits are configured to sequentially sample an input signal to generate a plurality of first signals, in which a circuit parameter of each of the plurality of sampling circuits is set according to a corresponding control signal in a plurality of control signals. The plurality of analog-to-digital converter circuits are configured to generate a plurality of first digital codes according to the plurality of first signals. The output circuit is configured to output a second digital code according to the plurality of first digital codes. The calibration circuit is configured to generate the plurality of control signals and adjust the plurality of control signals according to the second digital code.

15 Claims, 6 Drawing Sheets

(56) References Cited

OTHER PUBLICATIONS

S. Saleem and C. Vogel, Adaptive Blind Background Calibration of Polynomial-Represented Frequency Response Mismatches in a Two-Channel Time-Interleaved ADC, in IEEE Transactions on Circuits, Jun. 2011.

I. M. Filanovsky, J. Järvenhaara and N. T. Tchamov, "Source follower: A misunderstood humble circuit," 2013 IEEE 56th International Midwest Symposium on Circuits and Systems (MWSCAS), Columbus, OH, USA, 2013, pp. 185-188, doi: 10.1109/MWSCAS.2013.6674616.

Shedge, Mr. D. K. et al. "Analysis and Design of CMOS Source Followers and Super Source Follower" (2013), ACEEE Int. J. on Control System and Instrumentation.

M. El-Chammas and B. Murmann, A 12-GSs 81-mW 5-bit Time-Interleaved Flash ADC With Background Timing Skew Calibration, in IEEE Journal of Solid-State Circuits, vol. 46, No. 4, pp. 838-847, Apr. 2011, doi: 10.1109/JSSC.2011.2108125.

OA letter of a counterpart TW application (appl. no. 112123270) mailed on Apr. 24, 2024. Summary of the TW OA letter: 1. Claims 1, 5-6, and 10 are rejected as allegedly being anticipated by cited reference 1 (US 2013/0106632 A1). 2. Claims 2-4 and 7-9 are allowable. Correspondence bewteen claims of TW counterpart application and claims of US application: 1. Claims 1-8, 9, and 10 in TW counterpart application correspond to claims 1-8, 10, and 13 in US application, respectively.

* cited by examiner

TIME INTERLEAVED ANALOG TO DIGITAL CONVERTER AND SIGNAL CONVERSION METHOD

BACKGROUND OF THE INVENTION

1. Field of the Invention

The present disclosure relates to an analog-to-digital converter, especially to a time-interleaved analog-to-digital converter and a signal conversion method that are able to calibrate bandwidth mismatch.

2. Description of Related Art

In existing time-interleaved analog-to-digital converters, it is common to calibrate for undesired factors such as skew and gain error between channels to improve overall performance. However, issues such as bandwidth mismatch between channels still exist. To calibrate for bandwidth mismatch, a current approach requires complex calibration mechanisms that provide different correction parameters based on the frequency of the input signal, which results in a significant increment in both circuit area and power consumption.

SUMMARY OF THE INVENTION

In some aspects of the present disclosure, an object of the present disclosure is, but not limited to, provide a time-interleaved analog-to-digital converter and a signal conversion method that are able to calibrate bandwidth mismatch, so as to make an improvement to the prior art.

In some aspects of the present disclosure, a time-interleaved analog-to-digital converter includes a plurality of sampling circuits, a plurality of analog-to-digital converter circuits, an output circuit, and a calibration circuit. The plurality of sampling circuits are configured to sequentially sample an input signal to generate a plurality of first signals, in which a circuit parameter of each of the plurality of sampling circuits is set according to a corresponding control signal in a plurality of control signals. The plurality of analog-to-digital converter circuits are configured to generate a plurality of first digital codes according to the plurality of first signals. The output circuit is configured to output a second digital code according to the plurality of first digital codes. The calibration circuit is configured to generate the plurality of control signals and adjust the plurality of control signals according to the second digital code.

In some aspects of the present disclosure, a signal conversion method includes the following operations: sequentially sampling, by a plurality of sampling circuits, an input signal to generate a plurality of first signals, wherein a circuit parameter of each of the plurality of sampling circuits is set according to a corresponding control signal in a plurality of control signals; generating a plurality of first digital codes according to the plurality of first signals; outputting a second digital code according to the plurality of first digital codes; and adjusting the plurality of control signals according to the second digital code.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
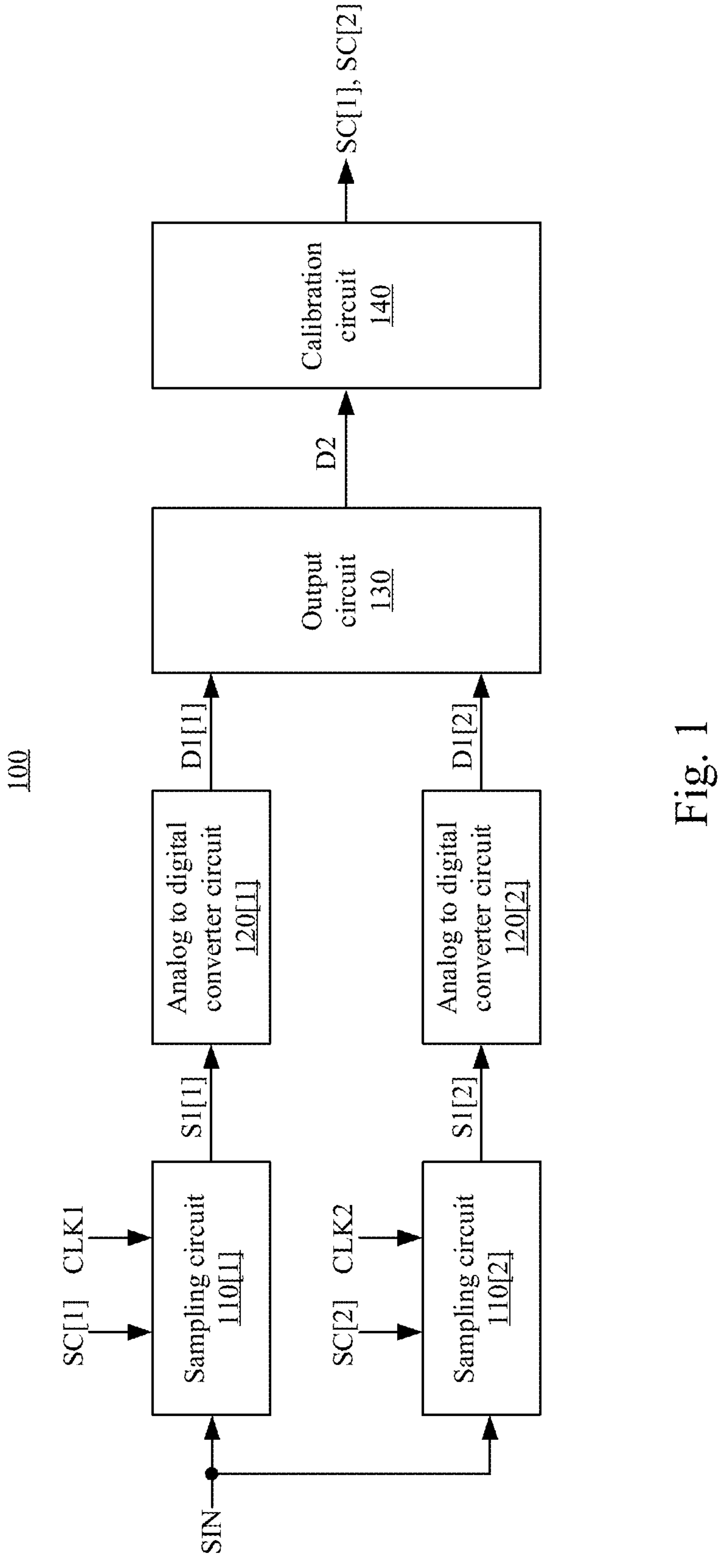
FIG. 1 illustrates a schematic diagram of a time-interleaved analog-to-digital converter according to some embodiments of the present disclosure.

FIG. 1 illustrates a schematic diagram of a time-interleaved analog-to-digital converter 100 according to some embodiments of the present disclosure. The time-interleaved analog-to-digital converter 100 includes sampling circuits 110[1] and 110[2], analog-to-digital converter circuits 120 [1] and 120[2], an output circuit 130, and a calibration circuit 140.

The sampling circuits 110[1] and 110[2] are configured to sequentially sample an input signal SIN to generate signals S1[1] and S1[2]. For example, the sampling circuit 110[1] may be selectively turned on according to a clock signal CLK1 to sample the input signal SIN to generate the signal S1[1]. Similarly, the sampling circuit 110[2] may be selectively turned on according to the clock signal CLK2 to sample the input signal SIN to generate the signal S1[2]. In some embodiments, a preset phase difference exists between the clock signals CLK1 and CLK2, which allows the sampling circuits 110[1] and 110[2] to be turned on during different periods to sequentially sample the input signal SIN. In some embodiments, a circuit parameter of each of the sampling circuits 110[1] and 110[2] is set according to a corresponding control signal of control signals SC[1] and SC[2]. For example, the circuit parameter of the sampling circuit 110[1] may be set by the control signal SC[1], and the circuit parameter of the sampling circuit 110[2] may be set by the control signal SC[2]. In some embodiments, the aforementioned circuit parameters may relate to at least one of the turn-on resistance and/or capacitance of a corresponding sampling circuit of the sampling circuits 110[1] and 110[2]. In some embodiments, these circuit parameters may be utilized to adjust the bandwidth of the corresponding sampling circuits, thereby reducing bandwidth mismatch between the sampling circuits 110[1] and 110[2]. The configuration of the sampling circuits 110[1] and 110[2] will be further explained in reference to other figures.

The analog-to-digital converter circuits 120[1] and 120[2] are configured to generate digital codes D1[1] and D1[2] according to the signals S1[1] and S1[2], respectively. In greater detail, the analog-to-digital converter circuit 120[1] may convert the signal S1[1] into the digital code D1[1], and the analog-to-digital converter circuit 120[2] may convert the signal S1[2] into the digital code D1 [2]. Each of the analog-to-digital converter circuits 120[1] and 120[2] may be, but is not limited to, a flash analog-to-digital converter circuit, a successive approximation register analog-to-digital converter circuit, a pipeline analog-to-digital converter circuit, and so on, and the present disclosure is not limited thereto. Various types of analog-to-digital converter circuits are within the contemplated scope of the present disclosure.

The output circuit 130 is coupled to the analog-to-digital converter circuits 120[1] and 120[2] to receive the digital codes D1[1] and D1[2]. The output circuit 130 may output these digital codes D1[1] and D1[2] as a digital code D2. In some embodiments, the output circuit 130 may be a parallel-to-serial converter circuit, which may convert parallel data (e.g., the digital codes D1[1] and D1[2]) into serial data (e.g., the digital code D2). In some embodiments, the output circuit 130 may be a multiplexer circuit.

The calibration circuit 140 outputs the control signals SC[1] and SC[2], and adjusts the control signals SC[1] and SC[2] according to the digital code D2. For example, during an initial period, the calibration circuit 140 may first output the control signals SC[1] and SC[2] having a first set of values to set the circuit parameters of the sampling circuits 110[1] and 110[2]. Under this condition, the calibration circuit 140 may obtain the digital code D2 corresponding to this first set of values and analyze a performance indicator of this digital code D2. Subsequently, the calibration circuit 140 may adjust the control signals SC[1] and SC[2] from the first set of values to a second set of values to adjust the circuit parameters of the sampling circuits 110[1] and 110 [2]. Under this condition, the calibration circuit 140 may obtain the digital code D2 corresponding to the second set of values and analyze the performance indicator of this digital code D2. Thus, the calibration circuit 140 may determine whether to use the control signals SC[1] and SC[2] with the first set of values or the second set of values according to the aforementioned performance indicators. Operations regarding herein will be further explained with reference to FIG. 2.

Figure 2:
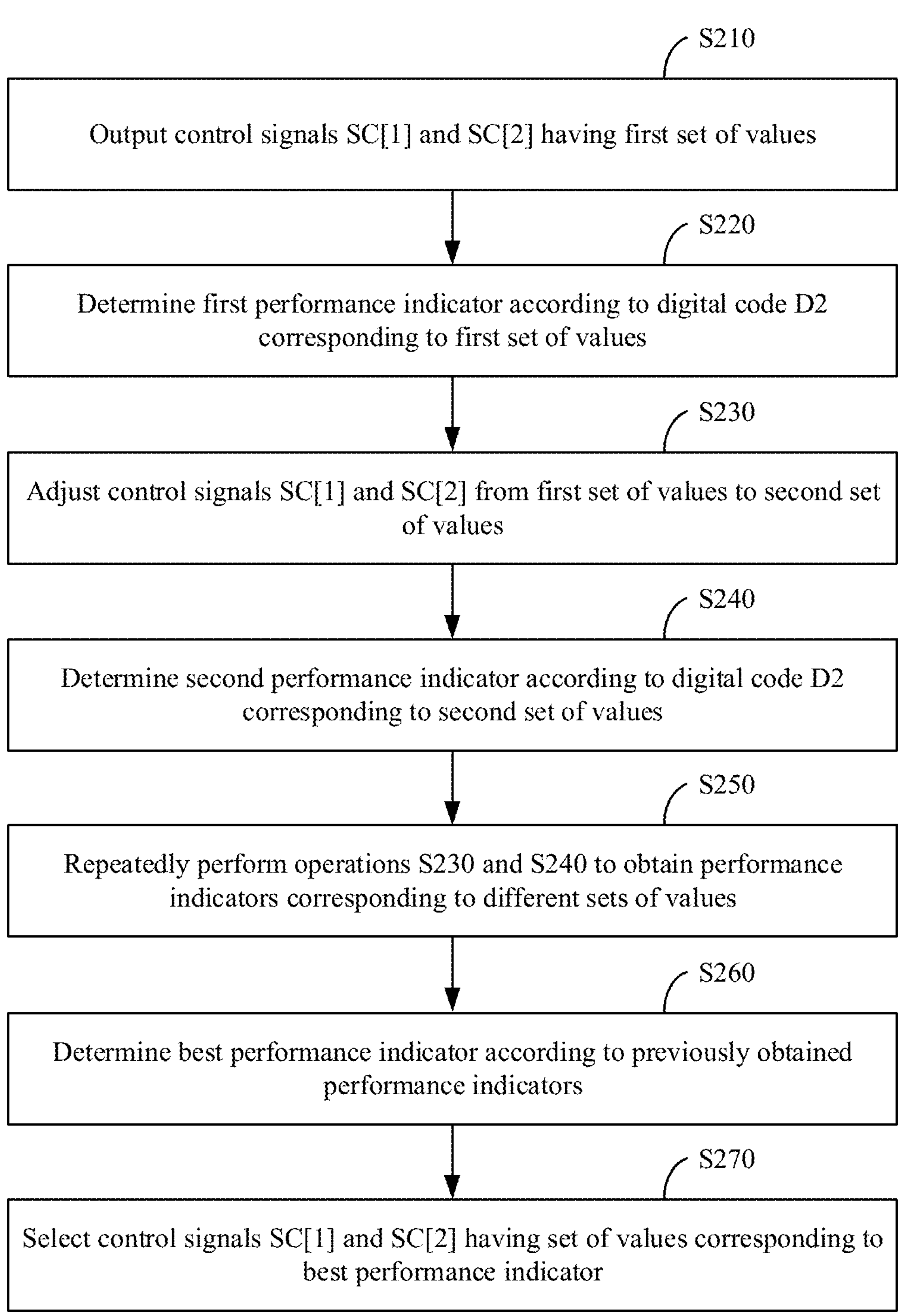
FIG. 2 illustrates a flowchart of operations performed by the calibration circuit in FIG. 1 according to some embodiments of the present disclosure.

In some embodiments, the calibration circuit 140 may be a signal processor circuit with computing capabilities, which may be configured to perform operations shown in FIG. 2. In some embodiments, the calibration circuit 140 may include one or more storage circuits (for example, but not limited to, registers), which may be configured to store the aforementioned performance indicators, the first set of values, and the second set of values, among other information.

It is understood that the number of circuits shown in FIG. 1 is given for illustrative purposes, and the present disclosure is not limited thereto. In different embodiments, the time-interleaved analog-to-digital converter 100 may include more sampling circuits and more analog-to-digital converters. Therefore, the present disclosure is not limited to the embodiments shown in FIG. 1.

FIG. 2 illustrates a flowchart of operations performed by the calibration circuit 140 in FIG. 1, according to some embodiments of the present disclosure. In operation S210, control signals SC[1] and SC[2] having a first set of values are outputted. In operation S220, a first performance indicator is determined according to the digital code D2 corresponding to the first set of values.

For example, during an initial period, the calibration circuit 140 may first output the control signals SC[1] and SC[2] having a first set of values (which may be a set of default values) to set the circuit parameters of the sampling circuits 110[1] and 110[2] to a default state. During this initial period, the calibration circuit 140 may also switch the input signal SIN to be a test signal. Under this condition, during the initial period, the calibration circuit 140 may obtain the digital code D2 corresponding to the first set of values and perform a performance analysis according to this digital code D2 to obtain a first performance indicator corresponding to the first set of values. In some embodiments, the aforementioned performance indicator may include at least one of the effective number of bits (ENOB), spurious free dynamic range (SFDR), or signal to noise ratio (SNR). The higher the value of the performance indicator, the higher the resolution of the digital code D2. These performance indicators are well known to those skilled in the art, hence not further elaborated here. The above performance indicators are given for illustrative purposes, and the present disclosure is not limited thereto. Various performance indicators that can indicate the resolution of the digital code D2 or the performance of the time-interleaved analog-to-digital converter 100 are within the contemplated scope of the present disclosure.

In operation S230, the control signals SC[1] and SC[2] are adjusted from a first set of values to a second set of values. In operation S240, a second performance indicator is determined according to the digital code D2 corresponding to the second set of values. In operation S250, operations S230 and S240 are repeatedly performed to obtain performance indicators corresponding to different sets of values. In operation S260, the best performance indicator is determined according to the previously obtained performance indicators. In operation S270, the control signals SC[1] and SC[2] having the set of values corresponding to this best performance indicator are selected.

For example, after obtaining the first performance indicator, the calibration circuit 140 can adjust control signals SC[1] and SC[2] from a first set of values to a second set of values (which are different from the first set). This change will alter the circuit parameters of the sampling circuits 110[1] and 110[2], enabling the calibration circuit 140 to obtain different digital codes D2. The calibration circuit 140 can analyze this digital code D2 to obtain the corresponding second performance indicator. The calibration circuit 140 can then adjust the control signals SC[1] and SC[2] from the second set of values to a third set of values (which are different from both the first and second sets of values), such that the calibration circuit 140 may obtain the corresponding third performance indicator. By this analogy, the calibration circuit 140 may sequentially output all combinations of values for the control signals SC[1] and SC[2] to obtain performance indicators corresponding to different sets of values. The calibration circuit 140 may store all previously obtained performance indicators and determine the best performance indicator among those indicators, so as to select the set of values corresponding to this best performance indicator. Consequently, the calibration circuit 140 may output the control signals SC[1] and SC[2] having the set of values corresponding to the best performance indicator. For example, if the calibration circuit 140 determines that the second performance indicator has the highest value or corresponds to the best performance among all performance indicators, the calibration circuit 140 may output the control signals SC[1] and SC[2] having the second set of values (corresponding to the second performance indicator), in order to adjust the circuit parameters of the sampling circuits 110[1] and 110[2] to improve circuit performance.

With such arrangements, the calibration circuit 140 may utilize the operations mentioned above to calibrate the circuit parameters of the sampling circuits 110[1] and 110[2], thereby reducing the bandwidth mismatch between these sampling circuits that arises due to non-ideal factors (which may include, for example but not limited to, manufacturing process variations).

In some related approaches, bandwidth mismatch between channels in the time-interleaved analog-to-digital converters is not calibrated. In such approaches, compensation parameters for the gain and/or time skew calibrations in the time-interleaved analog-to-digital converters may depend on the frequency of the input signal. To make these compensation parameters more accurate, more complex mechanisms (such as oversampling systems) are required to monitor the frequency of the input signal, in order to use corresponding compensation parameters based on the current frequency of the input signal. As a result, the overall circuit cost are significantly increased. Compared with those approaches, in some embodiments of the present disclosure, by using the calibration circuit 140, the bandwidth mismatch between channels can be reduced, thereby reducing the dependency of the aforementioned compensation parameters on the frequency of the input signal SIN. As a result, the gain and/or time skew calibrations of the time-interleaved analog-to-digital converters can be implemented without employing the aforementioned complex mechanisms.

In some embodiments, the sampling circuits 110[1] and 110[2] have the same circuit configuration. For ease of explanation, the following description will use the sampling circuit 110[1] as an example to illustrate several implementations, but the present disclosure is not limited thereto.

Figure 3B:
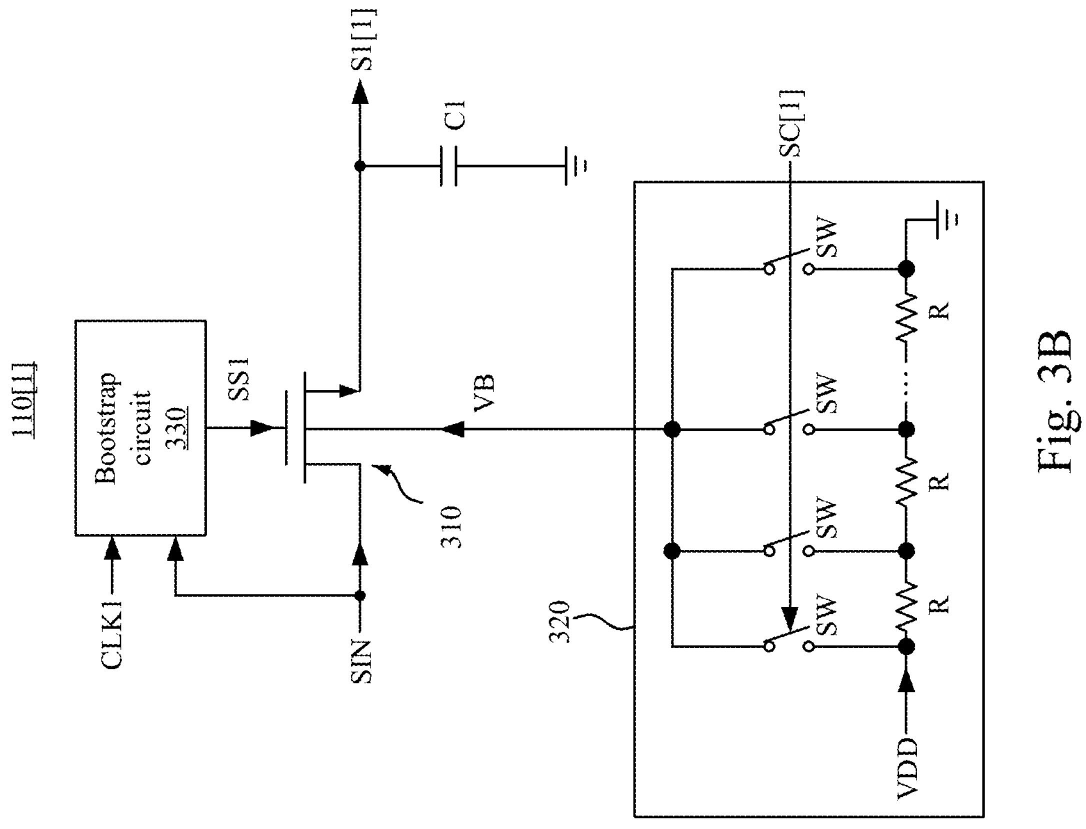
FIG. 3B illustrates a schematic diagram of the sampling circuit in FIG. 1 according to some embodiments of the present disclosure.
Figure 3A:
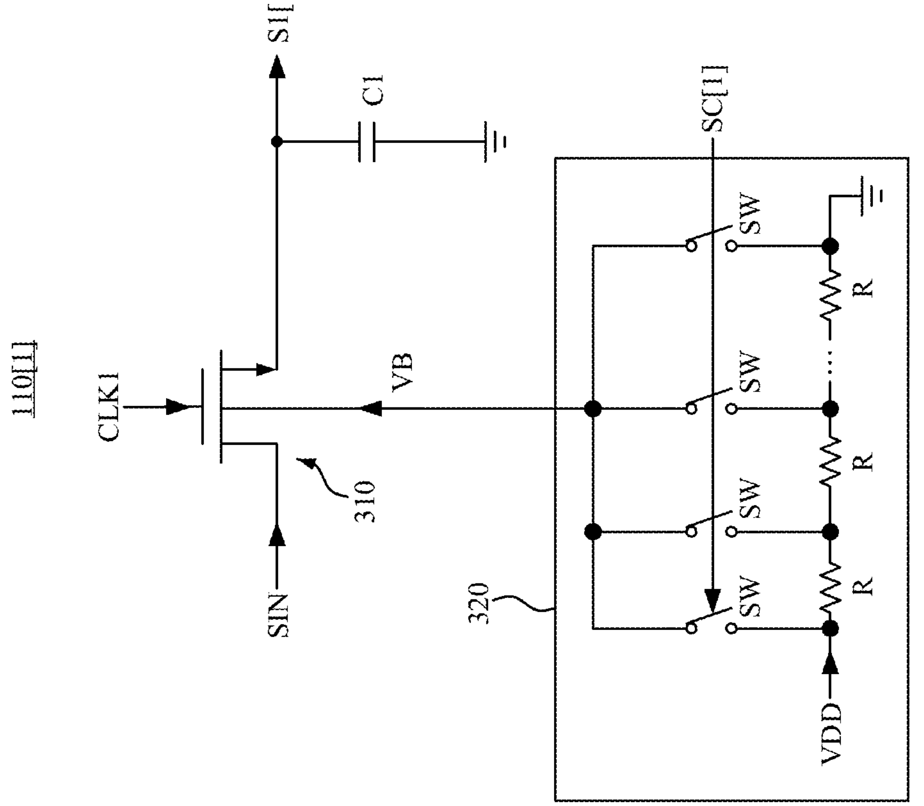
FIG. 3A illustrates a schematic diagram of the sampling circuit in FIG. 1 according to some embodiments of the present disclosure.

FIG. 3A illustrates a schematic diagram of the sampling circuit 110[1] in FIG. 1 according to some embodiments of the present disclosure. The sampling circuit 110[1] includes a transistor 310, a capacitor C1, and a digital-to-analog converter circuit 320. A first terminal of the transistor 310 (e.g., drain) receives the input signal SIN, a second terminal of the transistor 310 (e.g., source) is coupled to a first terminal of the capacitor C1, a control terminal of the transistor 310 (e.g., gate) receives the clock signal CLK1, and a third terminal of the transistor 310 (e.g., base) receives a bias voltage VB from the digital-to-analog converter circuit 320. A second terminal of the capacitor C1 is coupled to ground. The transistor 310 may be selectively turned on according to the clock signal CLK1 to transmit the input signal SIN to the capacitor C1, thereby sampling the input signal SIN. The capacitor C1 may output the sampled input signal SIN as the signal S1[1].

The digital-to-analog converter circuit 320 may generate the bias voltage VB according to the corresponding control signal SC[1]. In some embodiments, the digital-to-analog converter circuit 320 may be, but is not limited to, a resistive digital-to-analog converter, which may be configured to divide the supply voltage VDD according to the control signal SC[1] to generate the bias voltage VB. For example, the digital-to-analog converter circuit 320 may include resistors R and switches SW, in which the resistors R are coupled in series, and the switches SW are coupled between these resistors R and the transistor 310 and may be selectively turned on according to the control signal SC[1] to generate the bias voltage VB. In other words, the switches SW may be configured to set the connection relationship between the resistors R, thereby adjusting the voltage division ratio of the supply voltage VDD to generate different bias voltages VB. The aforementioned configuration of the digital-to-analog converter circuit 320 is given for illustrative purposes, and the present disclosure is not limited thereto. Various digital-to-analog converter circuits 320 that may be configured to generate the bias voltage VB are within the contemplated scope of the present disclosure.

In this example, the aforementioned circuit parameter can be the equivalent turn-on resistance of the sampling circuit 110[1]. For example, if the bias voltage VB is higher, the threshold voltage of the transistor 310 will decrease, leading to a lower turn-on resistance of the transistor 310. Thus, the equivalent turn-on resistance of the sampling circuit 110[1] will decrease. Alternatively, if the bias voltage VB is lower, the threshold voltage of the transistor 310 will increase, leading to a higher turn-on resistance of the transistor 310. Accordingly, the equivalent turn-on resistance of the sampling circuit 110[1] will increase. In this example, the transistor 310 is an N-type transistor, but the present disclosure is not limited thereto. In other embodiments, the transistor 310 may be a P-type transistor as well. When the transistor 310 is a P-type transistor, if the bias voltage VB is lower, the threshold voltage of the transistor 310 will decrease, leading to a lower turn on resistance; on the contrary, if the bias voltage VB is higher, the threshold voltage of the transistor 310 will increase, leading to a higher turn-on resistance.

With such arrangements, by adjusting the control signal SC[1], different turn-on resistances can be presented in the sampling circuit 110[1], thereby adjusting the bandwidth of the sampling circuit 110[1]. In this way, through the operations described in FIG. 2, the calibration circuit 140 can identify control signals SC[1] and SC[2] that enable the time-interleaved analog-to-digital converter 100 to achieve optimal performance.

FIG. 3B illustrates a schematic diagram of the sampling circuit 110[1] in FIG. 1 according to some embodiments of the present disclosure. Compared to the example in FIG. 3A, in the present disclosure, the sampling circuit 110[1] additionally includes a bootstrap circuit 330. The bootstrap circuit 330 may generate a switching signal SS1 according to the input signal SIN and the clock signal CLK1 to turn on the transistor 310. For example, the bootstrap circuit 330 may track the input signal SIN and generate the switching signal SS1, where a fixed preset voltage difference exists between the switching signal SS1 and the input signal SIN to ensure a more stable turn-on resistance of the transistor 310 during its turn-on period, thereby enhancing the performance of the sampling circuit 110[1]. In some embodiments, the bootstrap circuit 330 may be implemented with transistors and at least one capacitor (not shown), where the at least one capacitor is configured to generate the aforementioned preset voltage difference.

Figure 4B:
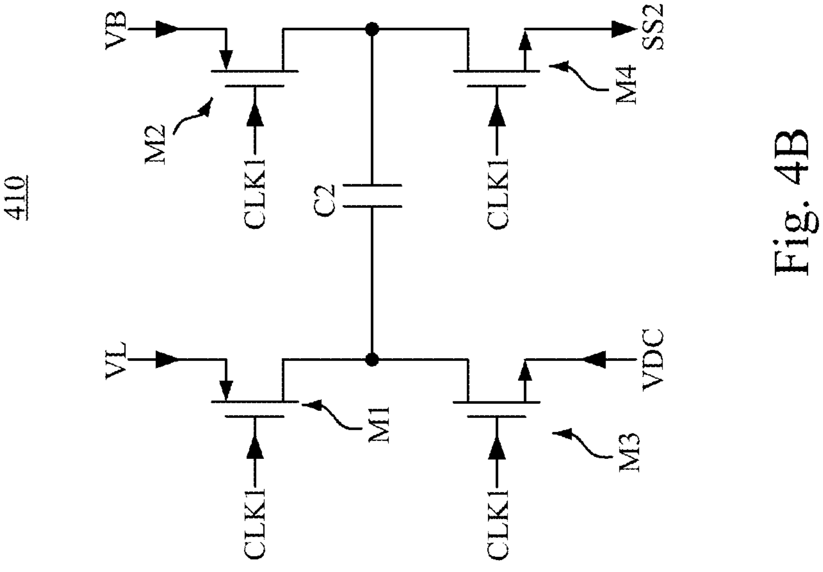
FIG. 4B illustrates a schematic diagram of the bootstrap circuit in FIG. 4A according to some embodiments of the present disclosure.
Figure 4A:
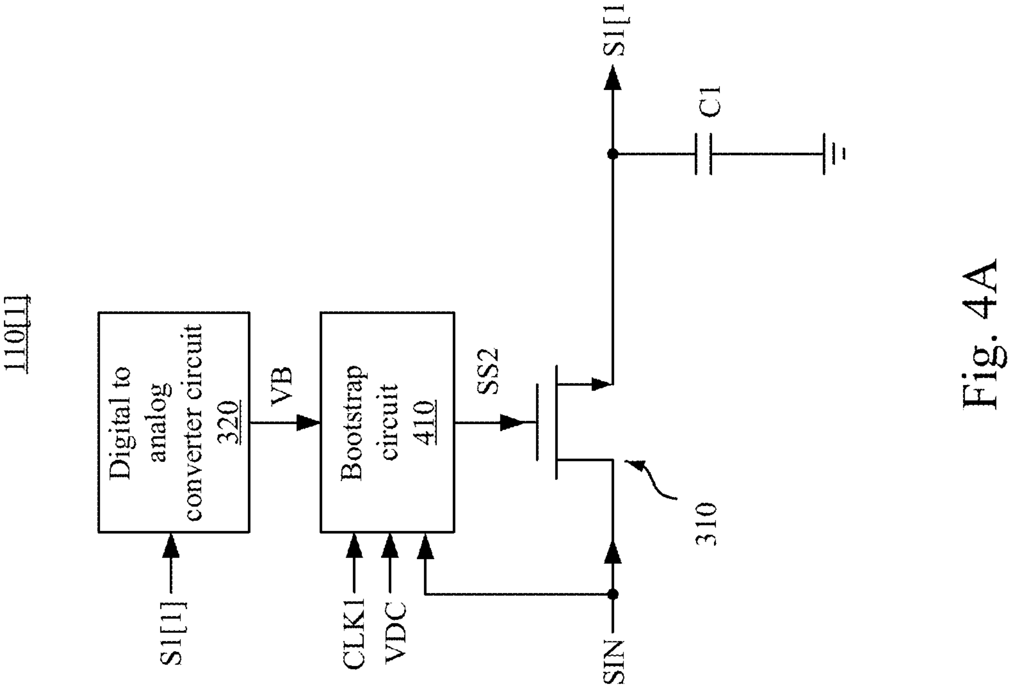
FIG. 4A illustrates a schematic diagram of the sampling circuit in FIG. 1 according to some embodiments of the present disclosure.

FIG. 4A illustrates a schematic diagram of the sampling circuit 110[1] in FIG. 1 according to some embodiments of the present disclosure. In this example, the sampling circuit 110[1] includes a transistor 310, a capacitor C1, a digital-to-analog converter circuit 320, and a bootstrap circuit 410. Different from FIG. 3B, in FIG. 4A, the digital-to-analog converter circuit 320 provides a bias voltage VB to the bootstrap circuit 410. The bootstrap circuit 410 may generate a switching signal SS2 to turn on the transistor 310 according to the clock signal CLK1, the bias voltage VB, and a predetermined voltage VDC. The bootstrap circuit 410 may track the predetermined voltage VDC to generate the switching signal SS2. When the transistor 310 is turned on, the switching signal SS2 is the sum of the bias voltage VB and the predetermined voltage VDC. Thus, if the bias voltage VB is higher, the enable level of the switching signal SS2 is higher, resulting in a lower turn-on resistance of the transistor 310. Alternatively, if the bias voltage VB is lower, the enable level of the switching signal SS2 is lower, resulting in a higher turn-on resistance of the transistor 310.

FIG. 4B illustrates a schematic diagram of the bootstrap circuit 410 in FIG. 4A according to some embodiments of the present disclosure. The bootstrap circuit 410 includes transistors M1 to M4 and a capacitor C2. A first terminal of the transistor M1 (e.g., source) receives a voltage VL, and a second terminal of the transistor M1 (e.g., drain) is coupled to a first terminal of capacitor C2, and a control terminal of the transistor M1 (e.g., gate) receives the clock signal CLK1. A first terminal of the transistor M2 receives the bias voltage VB, a second terminal of the transistor M2 is coupled to a second terminal of the capacitor C2, and a control terminal of the transistor M2 receives the clock signal CLK1. A first terminal of the transistor M3 is coupled to the first terminal of capacitor C2, a second terminal of the transistor M3 receives the predetermined voltage VDC, and a control terminal of the transistor M3 receives the clock signal CLK1. A first terminal of the transistor M4 is coupled to the second terminal of the capacitor C2, a second terminal of the transistor M4 outputs the switching signal SS2, and a control terminal of the transistor M4 receives the clock signal CLK1.

The transistors M1 and M2 are P-type transistors, and the transistors M3 and M4 are N-type transistors. The transistors M1-M4 may be selectively turned on according to the clock signal CLK1. In some embodiments, the voltage VL may be, but is not limited to, the ground voltage. When the clock signal CLK1 is at a low level, the transistors M1 and M2 are turned on, while the transistors M3 and M4 are not turned on. Under this condition, the transistor M1 transmits the voltage VL to the first terminal of the capacitor C2, and the transistor M2 transmits the bias voltage VB to the second terminal of the capacitor C2. As a result, the capacitor C2 is charged by the bias voltage VB, resulting in a voltage drop across two terminals of the capacitor C2 approximately equal to VB. Then, when the clock signal CLK1 is at a high level, the transistors M1 and M2 are not turned on, and the transistors M3 and M4 are turned on. As a result, the transistor M3 transmits the predetermined voltage VDC to the first terminal of the capacitor C2, and the transistor M4 outputs the voltage at the second terminal of the capacitor C2 as the switching signal SS2. Under this condition, the capacitor C2 is now charged by the predetermined voltage VDC, resulting in a voltage drop across the two terminals of the capacitor C2 equal to the sum of the predetermined voltage VDC and the bias voltage VB, and thus outputs the switching signal SS2 having a level equal to this voltage drop to turn on the transistor 310.

Figure 5A:
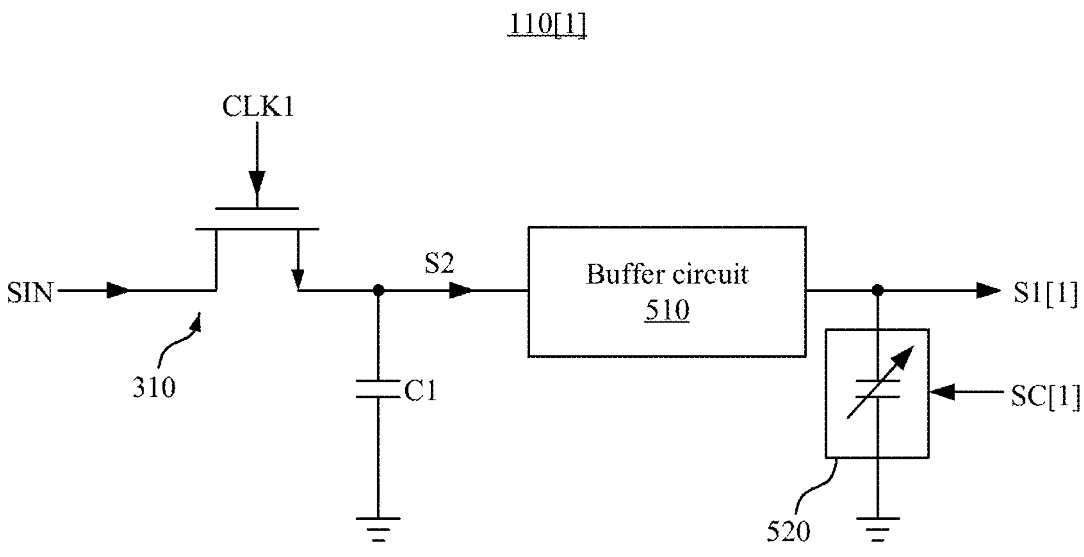
FIG. 5A illustrates a schematic diagram of the sampling circuit in FIG. 1 according to some embodiments of the present disclosure.

FIG. 5A illustrates a schematic diagram of the sampling circuit 110[1] in FIG. 1 according to some embodiments of the present disclosure. In this example, the aforementioned circuit parameter may be the equivalent capacitance of the sampling circuit 110[1]. The sampling circuit 110[1] includes a transistor 310, a capacitor C1, a buffer circuit 510, and a variable capacitor circuit 520. Different from FIG. 3A, in this example, the transistor 310 is turned on according to the clock signal CLK1 to sample the input signal SIN, and the capacitor C1 outputs the sampled input signal SIN as the signal S2. The buffer circuit 510 is coupled to capacitor C1 to receive the signal S2 and generates the signal S1[1] according to the signal S2. In some embodiments, the buffer circuit 510 may be, but is not limited to, a source follower, which may be configured to enhance the driving capability of the sampling circuit 110[1] to drive the analog-to-digital converter circuit 120[1] in FIG. 1. The variable capacitor circuit 520 is coupled to the output terminal of the buffer circuit 510, which outputs the signal S1[1], and adjusts the capacitance of the variable capacitor circuit 520 according to the control signal SC[1], thereby adjusting the equivalent capacitance of the sampling circuit 110[1]. In some embodiments, the sampling circuit 110[1] may exclude the buffer circuit 510, and the variable capacitor circuit 520 may be directly coupled to the output terminal of the transistor 310 (for example, the terminal of the transistor 310 coupled to the capacitor C1).

Figure 5B:
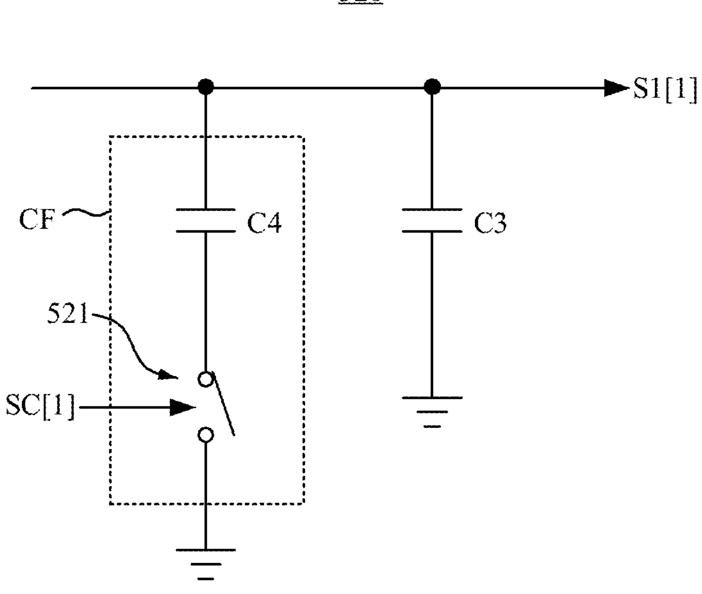
FIG. 5B illustrates a schematic diagram of the variable capacitor circuit in FIG. 5A according to some embodiments of the present disclosure.

FIG. 5B illustrates a schematic diagram of the variable capacitor circuit 520 in FIG. 5A according to some embodiments of the present disclosure. The variable capacitor circuit 520 includes a capacitor C3 and a capacitor array CF. The capacitor C3 is coupled between the output terminal of the buffer circuit 510 in FIG. 5A and ground. The capacitor array CF is coupled in parallel with the capacitor C3, and the capacitance of the capacitor array CF is set according to the control signal SC[1]. For example, the capacitor array CF may include a capacitor C4 and a switch 521. In other embodiments, the capacitor array CF may include multiple capacitors and multiple switches. In FIG. 5B, the capacitor C4 is coupled between the output terminal of the buffer circuit 510 in FIG. 5A and the switch 521, and the other terminal of the switch 521 is coupled to ground. The switch 521 may be selectively turned on according to the control signal SC[1]. When the switch 521 is turned on, the capacitor C4 is parallelly connected to capacitor C3, thereby increasing the capacitance of the capacitor array CF (or variable capacitor circuit 520). Conversely, when the switch 521 is not turned on, the capacitor C4 is disconnected from the capacitor C3, thereby reducing the capacitance of the capacitor array CF (or variable capacitor circuit 520).

The aforementioned arrangements of the sampling circuit 110[1] are given for illustrative purposes, and the present disclosure is not limited thereto. In other embodiments, the aforementioned arrangements may be implemented with each other. For example, the sampling circuit 110[1] in FIG. 5A may also incorporate the digital-to-analog converter circuit 320, the bootstrap circuit 330, and/or the bootstrap circuit 410 as referenced in FIGS. 3A, 3B, and/or 4A, etc. Additionally, the number of components shown in the aforementioned figures is given for illustrative purposes, and the present disclosure is not limited thereto.

Figure 6:
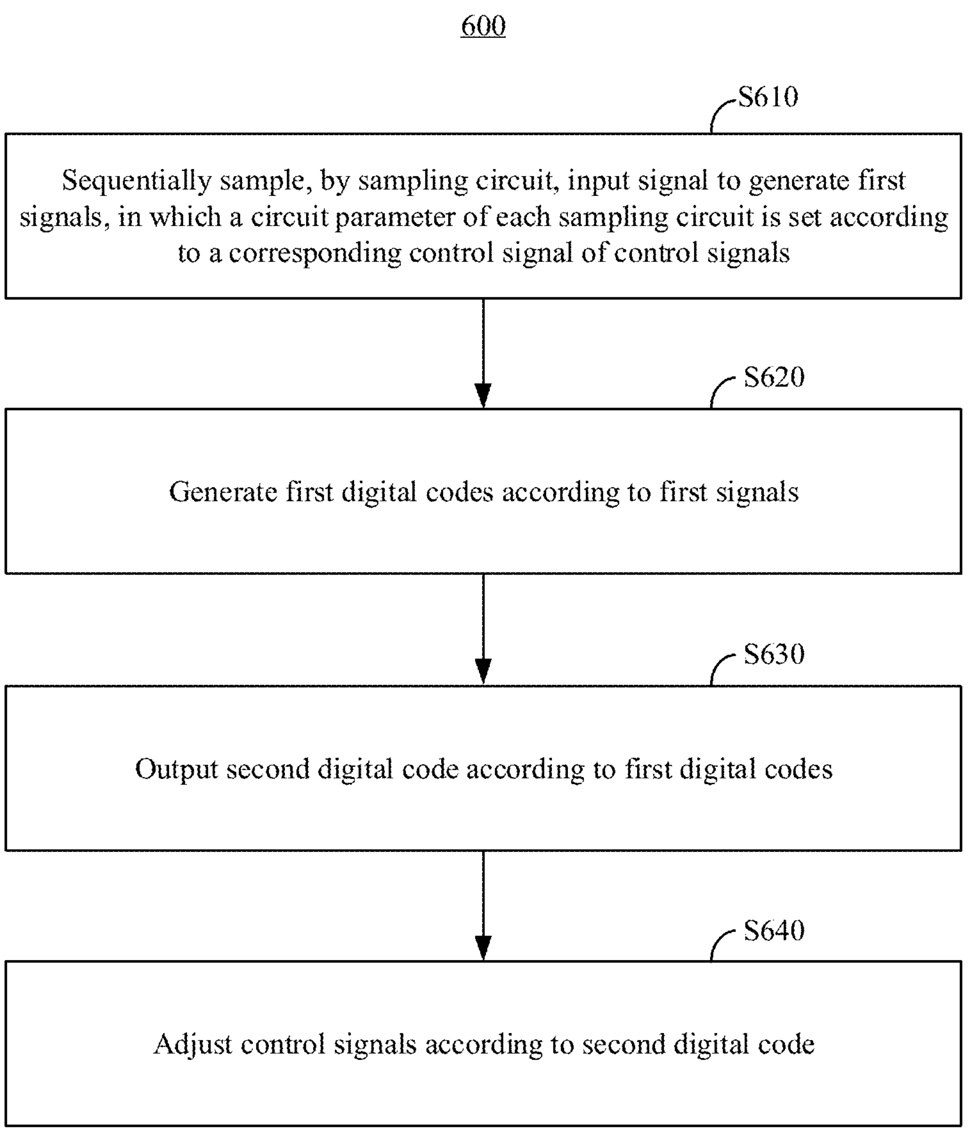
FIG. 6 illustrates a flowchart of a signal conversion method according to some embodiments of the present disclosure.

FIG. 6 illustrates a flowchart of a signal conversion method 600 according to some embodiments of the present disclosure. In some embodiments, the signal conversion method 600 may be executed by, but is not limited to, the time-interleaved analog-to-digital converter 100 shown in FIG. 1.

In operation S610, an input signal is sequentially sampled by sampling circuits to generate first signals, in which a circuit parameter of each of the sampling circuits is set according to a corresponding control signal of control signals. In operation S620, first digital codes are generated according to the first signals. In operation S630, a second digital code is outputted according to the first digital codes. In operation S640, the control signals are adjusted according to the second digital code.

The above operations of the signal conversion method 600 can be understood with reference to above embodiments, and thus the repetitious descriptions are not further given. The above operations in FIGS. 2 and 6 include exemplary operations, but those operations are not necessarily performed in the order described above. Operations in FIGS. 2 and 6 may be added, replaced, changed order, and/or eliminated, or the operations in FIGS. 2 and 6 may be executed simultaneously or partially simultaneously as appropriate, in accordance with the spirit and scope of various embodiments of the present disclosure.

As described above, a time-interleaved analog-to-digital converter and a signal conversion method provided in some embodiments of the present disclosure may utilize a simple calibration mechanism to correct the circuit parameters of the sampling circuits, thereby correcting the bandwidth mismatch among channels in the time-interleaved analog-to-digital converter.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog-to-digital converter, comprising:

a plurality of sampling circuits configured to sequentially sample an input signal to generate a plurality of first signals, wherein a circuit parameter of each of the plurality of sampling circuits is set according to a corresponding control signal in a plurality of control signals;

a plurality of analog-to-digital converter circuits configured to generate a plurality of first digital codes according to the plurality of first signals;

an output circuit configured to output a second digital code according to the plurality of first digital codes; and a calibration circuit configured to generate the plurality of control signals and adjust the plurality of control signals according to the second digital code, wherein the calibration circuit is configured to generate the plurality of control signals having a first set of values, determine a first performance indicator according to the second digital code corresponding to the first set of values, adjust the plurality of control signals from the first set of values to a second set of values, determine a second performance indicator according to the second digital code corresponding to the second set of values, and determine the plurality of control signals according to the first performance indicator and the second performance indicator.

2. The time-interleaved analog-to-digital converter of claim 1, wherein each of the first performance indicator and the second performance indicator comprises at least one of an effective number of bits (ENOB), a spurious free dynamic range (SFDR), or a signal to noise ratio (SNR).

3. The time-interleaved analog-to-digital converter of claim 1, wherein the circuit parameter comprises at least one of a turn-on resistance or a capacitance of a corresponding one of the plurality of sampling circuits.

4. The time-interleaved analog-to-digital converter of claim 1, wherein each of the plurality of sampling circuits comprises:

a transistor configured to be selectively turned on to sample the input signal; and a digital-to-analog converter circuit configured to generate a bias voltage according to the corresponding control signal and transmit the bias voltage to a body of the transistor.

5. The time-interleaved analog-to-digital converter of claim 4, wherein each of the plurality of sampling circuits further comprises:

a bootstrap circuit configured to turn on the transistor according to the input signal and a clock signal.

6. The time-interleaved analog-to-digital converter of claim 1, wherein each of the plurality of sampling circuits comprises:

a first capacitor;

a transistor configured to be selectively turned on according to a clock signal to transmit the input signal to the first capacitor, in order to generate a corresponding first signal in the plurality of first signals; and a variable capacitor circuit coupled to an output terminal of the transistor and configured to adjust a capacitance of the variable capacitor circuit according to the corresponding control signal.

7. The time-interleaved analog-to-digital converter of claim 6, wherein the variable capacitor circuit comprises:

a second capacitor coupled between the output terminal and ground; and a capacitor array coupled in parallel with the second capacitor, wherein a capacitance of the capacitor array is set according to the corresponding control signal.

8. The time-interleaved analog-to-digital converter of claim 7, wherein the capacitor array comprises:

a third capacitor coupled to the output terminal; and a switch coupled between the third capacitor and ground and configured to be selectively turned on according to the corresponding control signal.

9. The time-interleaved analog-to-digital converter of claim 1, wherein each of the plurality of sampling circuits comprises:

a first transistor configured to be selectively turned on to sample the input signal;

a digital-to-analog converter circuit configured to generate a bias voltage according to the corresponding control signal; and a bootstrap circuit configured to turn on the first transistor according to a clock signal, the bias voltage, and a predetermined voltage.

10. The time-interleaved analog-to-digital converter of claim 9, wherein the bootstrap circuit comprises:

a capacitor;

a second transistor configured to be selectively turned on according to the clock signal to transmit a first voltage to a first terminal of the capacitor;

a third transistor configured to be selectively turned on according to the clock signal to transmit the bias voltage to a second terminal of the capacitor;

a fourth transistor configured to be selectively turned on according to the clock signal to transmit the predetermined voltage to the first terminal of the capacitor; and a fifth transistor configured to be selectively turned on according to the clock signal to output a voltage at the second terminal of the capacitor as a switching signal to turn on the first transistor.

11. The time-interleaved analog-to-digital converter of claim 1, wherein each of the plurality of sampling circuits comprises:

a first capacitor;

a transistor configured to be selectively turned on according to a clock signal to transmit the input signal to the first capacitor to generate a second signal;

a buffer circuit configured to generate a corresponding first signal in the plurality of first signals according to the second signal; and a variable capacitor circuit coupled to an output terminal of the buffer circuit for outputting the corresponding first signal and configured to adjust a capacitance of the variable capacitor circuit according to the corresponding control signal.

12. A signal conversion method, comprising:

sequentially sampling, by a plurality of sampling circuits, an input signal to generate a plurality of first signals, wherein a circuit parameter of each of the plurality of sampling circuits is set according to a corresponding control signal in a plurality of control signals;

generating a plurality of first digital codes according to the plurality of first signals;

outputting a second digital code according to the plurality of first digital codes; and adjusting the plurality of control signals according to the second digital code, wherein adjusting the plurality of control signals according to the second digital code comprises:

generating the plurality of control signals having a first set of values;

determining a first performance indicator according to the second digital code corresponding to the first set of values;

adjusting the plurality of control signals from the first set of values to a second set of values;

determining a second performance indicator according to the second digital code corresponding to the second set of values; and determining the plurality of control signals according to the first performance indicator and the second performance indicator.

13. The signal conversion method of claim 12, wherein each of the first performance indicator and the second performance indicator comprises at least one of an effective number of bits (ENOB), a spurious free dynamic range (SFDR), or a signal to noise ratio (SNR).

14. The signal conversion method of claim 12, wherein the circuit parameter comprises at least one of a turn-on resistance or a capacitance of a corresponding one of the plurality of sampling circuits.

15. A time-interleaved analog-to-digital converter, comprising:

a plurality of sampling circuits configured to sequentially sample an input signal to generate a plurality of first signals, wherein a circuit parameter of each of the plurality of sampling circuits is set according to a corresponding control signal in a plurality of control signals;

a plurality of analog-to-digital converter circuits configured to generate a plurality of first digital codes according to the plurality of first signals;

an output circuit configured to output a second digital code according to the plurality of first digital codes; and a calibration circuit configured to generate the plurality of control signals and adjust the plurality of control signals according to the second digital code, wherein the circuit parameter comprises at least one of a turn-on resistance or a capacitance of a corresponding one of the plurality of sampling circuits.

* * * * *